US009105954B2

(12) United States Patent
Morgenstern et al.

(10) Patent No.: US 9,105,954 B2
(45) Date of Patent: Aug. 11, 2015

(54) BROADBAND DIRECTIONAL COUPLER

(75) Inventors: Michael Morgenstern, Schoneiche (DE); Dirk Fehse, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 561 days.

(21) Appl. No.: 13/513,171

(22) PCT Filed: Nov. 24, 2010

(86) PCT No.: PCT/EP2010/007136
§ 371 (c)(1),
(2), (4) Date: May 31, 2012

(87) PCT Pub. No.: WO2011/076328
PCT Pub. Date: Jun. 30, 2011

(65) Prior Publication Data

US 2012/0262249 A1 Oct. 18, 2012

(30) Foreign Application Priority Data

Dec. 23, 2009 (DE) ......................... 10 2009 060 157
Feb. 25, 2010 (DE) ......................... 10 2010 009 227

(51) Int. Cl.
*H01P 5/12* (2006.01)
*H01P 5/18* (2006.01)
*H03H 7/38* (2006.01)

(52) U.S. Cl.
CPC ..................................... *H01P 5/183* (2013.01)

(58) Field of Classification Search
USPC .......................... 333/109, 112, 115, 117, 118
See application file for complete search history.

(56) References Cited

U.S. PATENT DOCUMENTS

| | | | | |
|---|---|---|---|---|
| 6,066,994 | A | 5/2000 | Shepherd | |
| 7,095,394 | B2 * | 8/2006 | Hong | 345/89 |
| 7,884,683 | B2 * | 2/2011 | Ahlers | 333/112 |
| 2005/0264374 | A1 | 12/2005 | Podell | |
| 2014/0292360 | A1 * | 10/2014 | Morgenstern et al. | 324/713 |

FOREIGN PATENT DOCUMENTS

WO 2005/048396 A1 5/2005

OTHER PUBLICATIONS

International Preliminary Report on Patentability mailed Jul. 19, 2012, issued in corresponding International Application No. PCT/EP2010/007136, filed Nov. 24, 2010, 8 pages.

(Continued)

*Primary Examiner* — Dean Takaoka

(74) *Attorney, Agent, or Firm* — Christensen O'Connor Johnson Kindness PLLC

(57) ABSTRACT

The broadband directional coupler is used for measuring the power of a forward and/or a returning high-frequency signal on a line. For this purpose, the broadband directional coupler provides a voltage splitter which is connected to an inner conductor (1) of the line. This voltage splitter provides a first resistor (8) which is connected to an outer conductor of the line. The voltage splitter comprises ohmic resistors, and a first connection of a second resistor (4) is connected to the inner conductor (1) of the line, and a second connection of the second resistor (4) is connected to a first connection of a third resistor (6). A second connection of the third resistor (6) is connected directly or indirectly to a first connection of the first resistor (8) and at the same time to the outer conductor of the line. In this context, a measured voltage is picked up at the second connection of the second resistor (4) or at the first connection of the third resistor (6).

17 Claims, 5 Drawing Sheets

(56) References Cited

OTHER PUBLICATIONS

Hoer, C.A., and D.L. Agy, "Broad-Band Resistive-Divider-Type Directional Coupler," IEEE Transactions on Instrumentation and Measurement 19(4):336-343, Nov. 1970.

International Search Report mailed Oct. 3, 2011, issued in corresponding International Application No. PCT/EP2010/007136, filed Nov. 24, 2010, 3 pages.

* cited by examiner

BROADBAND DIRECTIONAL COUPLER

FIELD OF THE DISCLOSURE

The invention relates to a directional coupler for measuring the power of a forward and a returning high-frequency signal on a coaxial line within a broad frequency range, for example, within the range from 9 kHz to 250 MHz. In this context, the broadband directional coupler is designed for powers up to 250 W.

BACKGROUND

Directional couplers are often used together with power amplifiers in order to identify rapidly and safely whether an error matching is present or not. If the power of the forward and returning high-frequency signal can be registered, the power amplifier can be automatically switched off before any damage occurs when a guide value for the returning high-frequency signal is exceeded. The broadband properties of a directional coupler of this kind are particularly necessary for interference-prevention tests, in order to investigate the functionality of the device under test within a broad frequency range. Accordingly, dependent upon the frequency range and the test standard, different antennas and setups are used for coupling interference signals into the device under test. Broken cables, error plug connections or faulty antennas are only some of the possibilities which can lead to error matching. Dependent upon cable attenuations and the antenna characteristic, the necessary output power of the power amplifier varies significantly over the frequency range under test.

A generic arrangement of the directional coupler is already known from U.S. Pat. No. 6,066,994. The directional coupler is structured in a symmetrical manner, wherein the outer conductor of the coaxial line is split at two places and connected in each case via a shunt resistor to the outer conductor of the coaxial line at the input and output. A ferrite core ensures that both ends of the outer conductor are insulated from one another for low frequencies. A measured voltage proportional to the inner-conductor current decreases across the shunt resistor, which is polarised differently dependent upon the direction of the power flow. A capacitive voltage splitter, which is connected to the inner conductor, generates a measured voltage proportional to the inner-conductor voltage. This measured voltage is applied to the gate of a field-effect transistor (FET). Source and drain of the FET are connected via several resistors to the direct voltage source. The measured voltage proportional to the internal-conductor voltage and de-coupled at the source connection is added to or subtracted from the measured voltage proportional to the inner-conductor current decreasing across a shunt resistor, a capacitor, a resistor and a coaxial cable. In the case of matching, both voltages are added in one branch, but they are subtracted in the other branch to form a zero voltage. In the case of an error matching, the voltage difference is not zero. In the case of an infinite VSWR (Voltage Standing Wave Ratio; standing-wave ratio), both voltages are of the same magnitude.

The disadvantage with the arrangement of U.S. Pat. No. 6,066,994 is a complicated structure required in order to integrate all other components into the overall system. The necessary resistors are principally designed as wired resistors. The bending of the connecting arms of the resistors and respectively the coaxial cables, and also the soldering process itself, must be carried out manually. This means that each directional coupler provides slightly different properties. Furthermore, the capacitive voltage splitter has proved disadvantageous. To ensure that the directional coupler can operate at all in the low frequency range, this capacitive voltage splitter must hardly be loaded. Accordingly, the use of an FET as an impedance converter is indispensable. Moreover, two further voltage sources are necessary for the FET itself, which further increases the already high wiring costs and makes an external voltage supply additionally necessary.

SUMMARY

The invention is therefore based upon the object of providing a broadband directional coupler, which is structured in a significantly simpler manner and accordingly does not require active components. The broadband directional coupler should preferably operate reliably within a broad frequency range, for example, from 9 kHz to 250 MHz and should be able to detect powers preferably up to 250 W.

The object is achieved by the broadband directional coupler according to the invention with the features of claim 1. The independent claims specify advantageous further developments of the invention.

The broadband directional coupler is used for measuring the power of a forward and/or returning high-frequency signal on a line. The broadband directional coupler provides a voltage splitter, which is connected to an inner conductor of the line, and a first resistor, which is connected to an outer conductor of the line. The voltage splitter provides ohmic resistors, and a first connection of a second resistor is connected to the inner conductor of the line, and a second connection of the second resistor is connected to a first connection of a third resistor. A second connection of the third resistor is connected directly or indirectly to a first connection of the first resistor and at the same time to the outer conductor of the line.

In this context, a measured voltage is preferably picked up at the second connection of the second resistor or at the first connection of the third resistor.

The broadband directional coupler according to the invention provides an ohmic instead of a capacitive voltage splitter. This voltage splitter can be loaded significantly more heavily, so that no active components are required as impedance converters. Accordingly, not only the wiring costs within the broadband directional coupler are reduced, but an external voltage supply is additionally dispensed with. The matching of the broadband directional coupler according to the invention is therefore significantly simpler, so that, on the one hand, the production time is reduced and, on the other hand, the individual broadband directional couplers do not differ in their properties.

DESCRIPTION OF THE DRAWINGS

Various exemplary embodiments of the invention are described by way of example with reference to the drawings. Identical subject matters are provided with the same reference numbers. The drawings are as follows.

DETAILED DESCRIPTION

Figure 1:
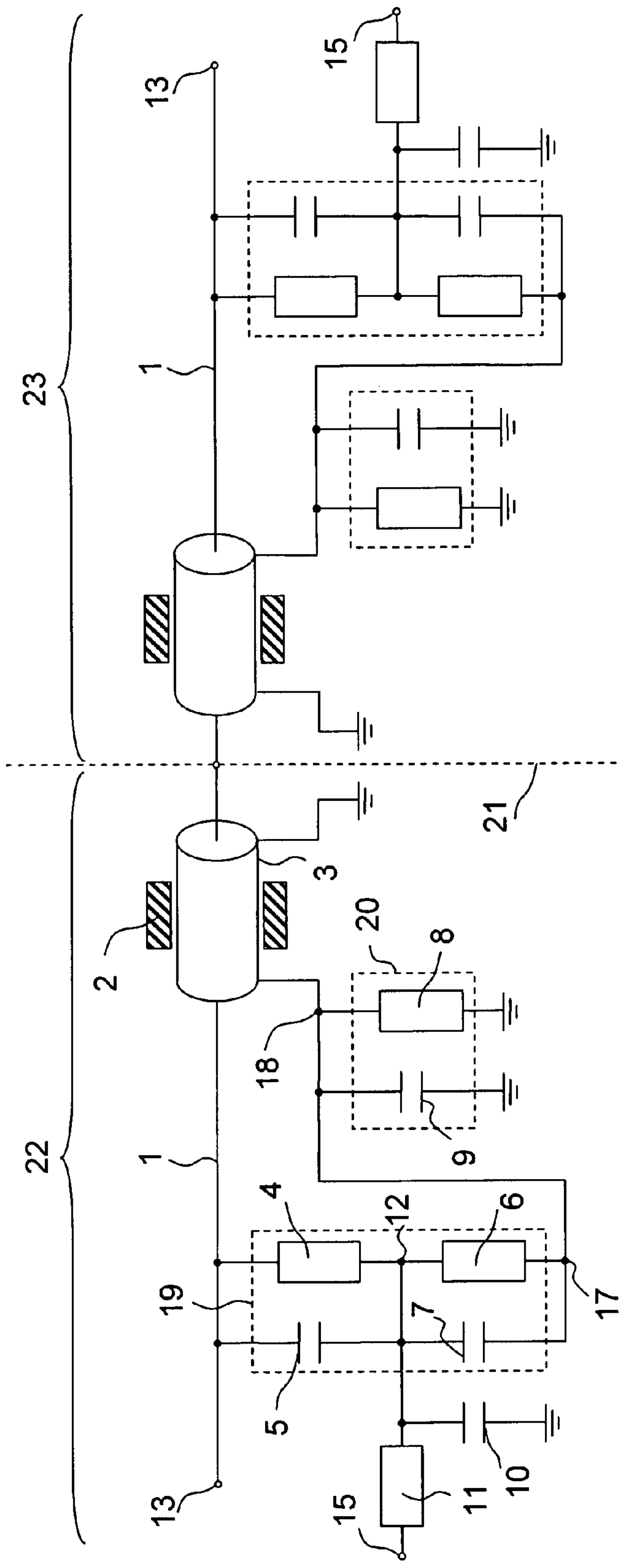
FIG. 1 shows a simplified circuit diagram of the arrangement according to the invention of the broadband directional coupler.

FIG. 1 shows a simplified circuit diagram of the broadband directional coupler according to the invention. The circuit diagram is structured in exact mirror-image symmetry about the axis 21. The broadband directional coupler is built up from two mutually independent measuring units 22 and 23. At the input connection 13 of the first measuring unit 22, the signal source and also a complex load can be connected via a coaxial cable. The same applies for the input connection 13 of the second measuring unit 23. Via the inner conductor 1 extending through the two measuring units 22, 23, a high-frequency signal is transmitted from the power amplifier to the complex load.

In the following section, the measuring unit 22 will be described in greater detail. Each measuring unit 22, 23 provides two four-pole networks 19, 20. The first four-pole network 19 comprises a voltage splitter, comprising the ohmic resistors 4 and 6, which is used to split a high-frequency voltage down to a small measured voltage in the most frequency-independent manner possible. The first resistor 4 is connected at its first connection in a direct galvanic manner to the inner conductor 1. Its second connection is connected to the first connection of a second resistor 6. Between the two resistors 4, 6, the split measured voltage can be picked up at the node 12.

The first resistor 4 must be designed to be a high ohmic resistor (for example, 30 k ohms). However, it must be taken into consideration that the resistor 4 provides a resistance value of, for example, 30 k ohms, only with a DC voltage up to a low-frequency AC voltage. For high-frequency AC voltages (for example, from 250 MHz), the resistor 4 provides, according to design, only an ohmic resistance value of, for example, 500 ohms and, in total, a complex impedance. With increasing frequency, the current flowing through resistor 4 accordingly increases by a multiple factor. For this reason, the resistor 4 must be capable of releasing again the thermal energy absorbed. This is best achieved by selecting a resistor with the largest possible surface area.

In the present invention, all of the resistors and capacitors are preferably designed as SMD components (surface-mounted device, surface-mounted component). On one hand, this facilitates automatic fitting and, on the other hand, the thermal energy can be released directly to the printed-circuit-board material, so that the thermal transfer is significantly better than in air. The resistor 4 is therefore realised, for example, with the structural form 2512. Because of the necessarily large structural form, the cap capacitance is developed more strongly than in the case of resistors with smaller structural forms. The cap capacitance of the resistor 4 is shown in the circuit diagram as the capacitance 5. This capacitance 5 is a purely parasitic capacitance, which must be taken into consideration because of its magnitude of, for example, up to 0.1 pF.

The resistor 6 has a significantly smaller structural form (for example, 0402). Accordingly, a smaller cap capacitance is developed, which means that the time constant $T_1$ comprising the resistor 4 and its cap capacitance 5 differs significantly from the time constant $T_2$ comprising the resistor 6 and its cap capacitance. For this reason, in the exemplary embodiment, a capacitor 7 is additionally connected with its connections in parallel to the connections of the resistor 6. The capacitor 7 is a capacitor, of which the capacitance can be adjusted in a variable manner (trimming capacitor). Accordingly, the circumstance is taken into consideration that the cap capacitance 5 of the resistor 4 can be of a different magnitude from component to component.

A further adjustable capacitor 10 (trimming capacitor) is connected with its first connection at the potential of the node 12. Its second connection, by contrast, is connected to ground. The first connection of the capacitor 10 is connected to the de-coupling connection 15 via the resistor 11. The trimming capacitor 10 is used here for matching the frequency response in the forward direction. The capacitance of the trimming capacitor 7 is adjusted in such a manner that a time constant $T_2$ results from the trimming capacitor 7 and the resistor 6, which is as precisely identical to the further time constant $T_1$, which results from the resistor 4 together with its cap capacitance 5, as possible. Accordingly, the directional ratio is matched, and it is ensured that only a minimal voltage in the return direction is present at the de-coupling connection 15, when matching (VSWR=1) predominates at the respective output.

The resistor 11 ensures that the trimming capacitor 10 need only provide a small terminal capacitance. The second connections of the trimming capacitor 7 and of the resistor 6 are connected to the node 17. Also with the potential of the node 17, a first connection of the resistor 8 is connected via the node 18. At the same potential, a first connection of the capacitor 9 is also connected. The second connections of the capacitor 9 and of the resistor 8 are connected to ground. The resistor 8 is preferably designed to provide a very low ohmic resistance.

The outer conductor of the coaxial line connected to the input connection 13 in the broadband directional coupler is split into an internal 3 and an external outer conductor 38 not illustrated in FIG. 1, wherein the internal outer conductor 3 is connected only at one end directly to the external outer conductor 38 and accordingly to ground. The second end of the internal outer conductor 3 is connected directly or indirectly via the node 18 and therefore via the first connection of the resistor 8 to the external outer conductor 38 and therefore to ground. Between the internal 3 and the external outer conductor 38, at least one high-permeability toroidal-tape core 2 is arranged. This guarantees that a significant current flows across the resistor 8. The voltage decreasing across the resistor 8 is proportional to the inner conductor current, so long as the resistor 8 does not provide any parasitic inductances. In reality, this is not the case, so that a capacitor 9 has to be connected in parallel to the connections of the resistor 8.

This capacitor 9 compensates the parasitic inductance of the resistor 8 at a reference frequency of 250 MHz. Dependent upon whether the high-frequency signal travels from the input connection 13 of the first measuring unit 22 to the input connection 13 of the second measuring unit 23 or vice versa, a positive or negative voltage decreases across the resistor 8. With corresponding matching, the measured voltages occurring at the two four-pole networks 19, 20 have the same value, the same phase response and are frequency independent. Dependent upon the sign of the two measured voltages, these are added or subtracted at the node 12 in a vectorial manner. The voltage resulting at the node 12 can then be picked up at the de-coupling connection 15.

Each measuring unit 22, 23 provides at least one input connection 13 and at least one de-coupling connection 15. Both the input connection and also the de-coupling connection can be connected to a source or a complex load. The arrangement is operated in the forward direction if the signal source is connected to the input connection 13 of the first measuring unit 22, and the complex load is connected to the input connection 13 of the second measuring unit 23. A voltage proportional to the root of the power of the forward high-frequency signal is provided at the coupling connection 15 of the first measuring unit 22, whereas a voltage proportional to the power of the returning high-frequency signal is provided at the de-coupling connection 15 of the second measuring unit 23.

The broadband directional coupler can, however, also be operated in the return direction without the attenuation varying. In this case, the signal source is connected to the input connection 13 of the second measuring unit 23, and the complex load is connected to the input connection 13 of the first measuring unit 22. A voltage proportional to the root of the power of the forward high-frequency signal is provided at the de-coupling connection 15 of the second measuring unit 23, whereas a voltage proportional to the root of the returning high-frequency signal is provided at the de-coupling connection 15 of the first measuring unit 22.

Figure 2A:
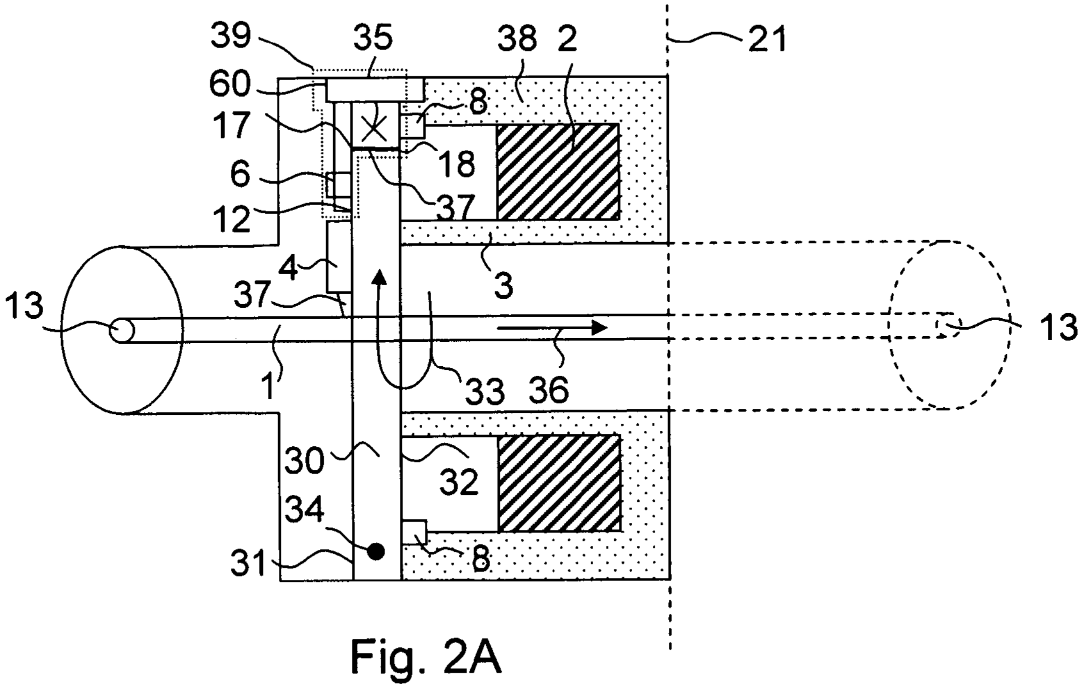
FIG. 2A shows the parasitic coupling of the magnetic field into the measurement loop with an unfavourable arrangement of the components.

FIG. 2A illustrates the parasitic effects, which arise from the fact that the outer conductor must be opened in order to attach the ohmic voltage splitter comprising the resistors 4 and 6 to the inner conductor, and the resistor 8 to the outer conductor. FIG. 2A shows the first measuring unit 22 of the broadband directional coupler according to the invention. The second measuring unit 23, which is structured in exact mirror-image symmetry to the first measuring unit 22, is indicated with dotted lines. In the exemplary embodiment in FIG. 2A, a signal source, which is not illustrated, is connected to the input connection 13 of the first measuring unit 22. The input connection 13 of the second measuring unit 23 is connected to a complex load, which is not illustrated. By way of example, a current flow along the inner conductor 1 is indicated in the direction of the arrow from the input connection 13 of the first measuring unit 22 to the input connection 13 of the second measuring unit 23. The inner conductor 1 in this context is guided through a recess 40, which is not illustrated, in the printed-circuit board 30 and through the latter.

On a side 31 of the printed-circuit board 30 facing towards the input connection 13, the first resistor 4 is connected galvanically via the soldered connection 37 to the inner conductor 1. On the same side 31 of the printed-circuit board 30, the second connection of the first resistor 4 is connected via the node 12 to the first connection of a second resistor 6, as also shown in the circuit diagram from FIG. 1. Moreover, from the node 12, a connection is made across the resistor 11, which is not illustrated, to the de-coupling connection 15, to which a coaxial plug connection 60 is connected.

The second connection of the second resistor 6 is connected to the node 17. Via a through contact 37, the node 17, which is disposed on the side 31 of the printed-circuit board 30 facing towards the input connection 13, is connected to the node 18, which is disposed on the side 32 of the printed-circuit board 30 facing away from the input connection 13. The length of the through contact 37 is identical with the thickness of the printed-circuit board 30 and, in the case of a two-layer FR4 multi-layered printed circuit board, is, for example, 1.6 mm. The node 18 is connected directly to the first connection of the resistor 8 as shown in FIG. 1. As is evident from FIG. 2A, the resistor 8 in the exemplary embodiment comprises not only a single resistor, but several individual resistors, which connect the internal outer conductor 3 to the external outer conductor 38. The further capacitors 5, 7, 9, 10 and the resistor 15 have not been illustrated in FIGS. 2A and 2B for reasons of visual clarity.

The dotted surface represents a measuring loop 39. This comprises the second resistor 6 of the voltage splitter and the coaxial plug connection 60 on the first side 31 of the printed-circuit board 30. The signal line from the node 12 to the coaxial plug connection 60 is disposed on the first side 31 of the printed-circuit board 30 and has been indicated at a distance from the printed-circuit board 30 only for reasons of clarity. Via the through contact 37, the node 17 on the first side 31 of the printed-circuit board 30 is connected to the node 18 on the second side 32 of the printed-circuit board 30. The resistor 8 is disposed on the second side of the printed-circuit board. The second connection of the resistor 8 is connected to the outer conductor 38. Via through contacts in the printed-circuit board 30, which are not illustrated, the outer conductor 38 is connected to the coaxial plug connection 60 and to the outer conductor on the first side 31 of the printed-circuit board 30. The measuring loop 39 is closed.

As shown in FIG. 2A, a current on the inner conductor flowing in the direction of the arrow 36 generates a magnetic field, of which the field lines extend in a circular manner around the inner conductor 1. The magnetic field lines extend in the direction of the arrow 33. They emerge at the point 34, and re-enter at the point 35. The area enclosed by the measuring loop 39 is passed through by the field lines of the magnetic field, thereby inducing a voltage in the measuring loop 39. This coupling occurs with an angular error of 90°. The measured voltage proportional to the root of the power of the forward high-frequency signal, which provides an average forward attenuation of, for example, 57.5 dB, is strongly disturbed by the induced voltage. The measured voltage proportional to the root of the power of the returning high-frequency signal, which provides an average return attenuation of, for example, 95 dB, is superimposed by the induced voltage in such a manner that it can no longer be measured.

The parasitic coupling according to the situation presented also occurs with the connection of the signal source to the input connection 13 of the second measuring unit 23 and of the complex load to the input connection 13 of the first measuring unit 22.

Figure 2B:
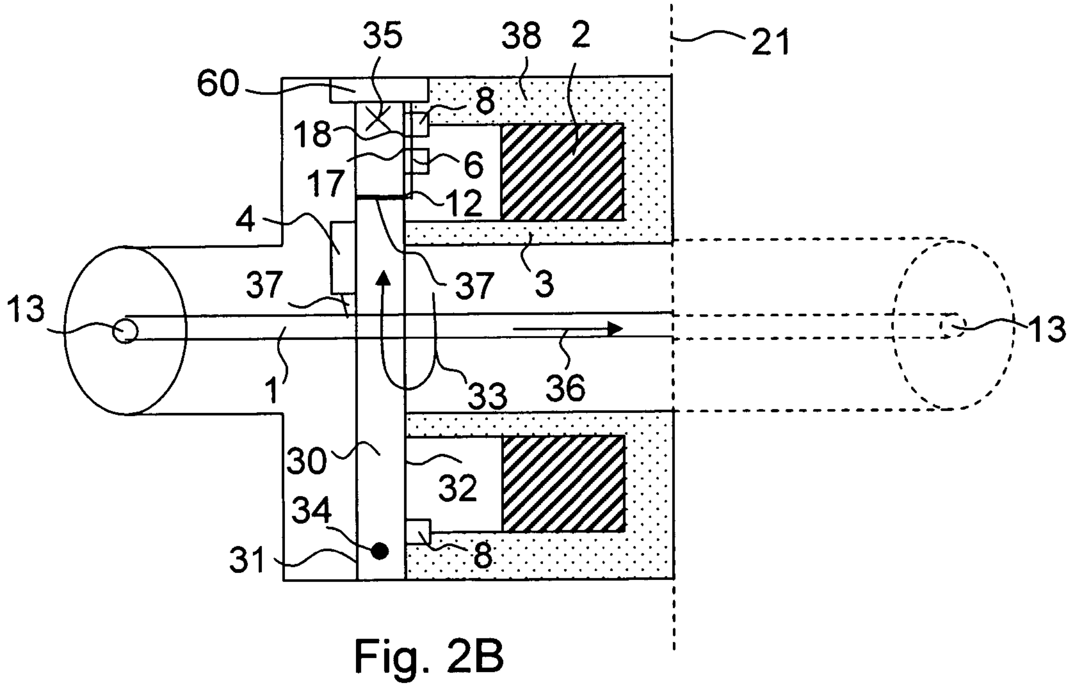
FIG. 2B shows the preferred arrangement of the components for the avoidance of a parasitic coupling of the magnetic field into the magnetic loop.

In the following section, FIG. 2B shows the solution preferred according to the invention for the avoidance of parasitic couplings into the measuring loop. The structure and the direction of current are substantially the same as in the case of FIG. 2A, and accordingly, reference is made here to the description for FIG. 2A. Both resistors 4 and 6 of the voltage splitter should not therefore be disposed on the same side of the printed-circuit board 30. Accordingly, the resistor 6 of the voltage splitter is no longer disposed on the first side 31 of the printed-circuit board 30, but is arranged on the side 32 of the printed-circuit board 30 facing away from the input connection 13, where the resistor 8 is also arranged. The signal line from the node 12 to the coaxial plug connection 60 is disposed on the second side 32 of the printed-circuit board 30 and has been indicated only for reasons of clarity at a distance from the printed-circuit board 30. This type of arrangement means that a closed measurement loop, by means of which a voltage can be induced through a magnetic field, is not established via the outer conductor. All of the resistors 4, 6, 8, 11 and all of the capacitors 7, 9, 10 of a measuring unit 22, 23 are arranged in this context on one printed-circuit board 30.

Figure 3A:
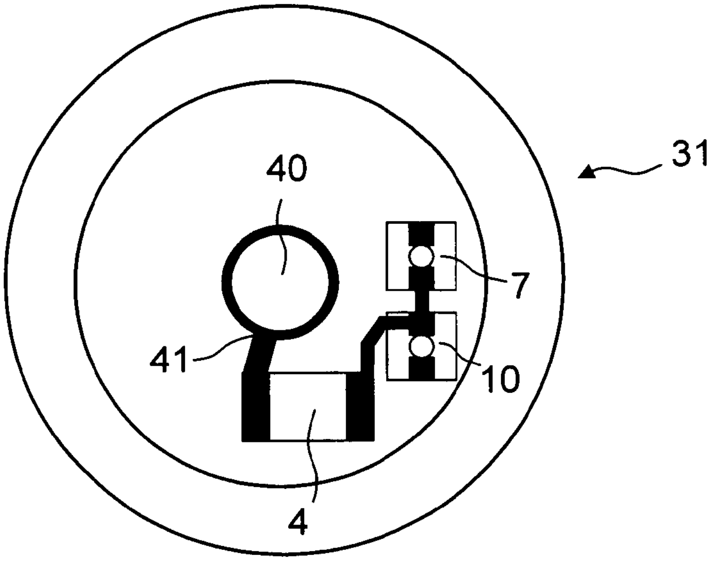
FIG. 3A shows an exemplary embodiment of the upper side of the printed-circuit board of the broadband directional coupler according to the invention.

FIG. 3A shows the first side 31 of the printed-circuit board 30. The printed-circuit board 30 provides a circular recess 40 in the centre, through which the inner conductor 1 is guided. The inner conductor 1 is connected to the first side 31 of the printed-circuit board 30 via a soldered connection 37 and/or a screw connection in such a manner that a low ohmic electrical contact is established between the inner conductor 1 and the strip conductor 41. This strip conductor 41 connects the first connection of the resistor 4 galvanically to the inner conductor 1. The second connection of the resistor 4 is connected to the first connection of the trimming capacitors 7 and 10. A through contact 37, which connects the first side 31 to the second side 32 of the printed-circuit board 30 is disposed between the first connections of the trimming capacitors 7 and 10. The second connection of the capacitor 10 is connected to ground. The second connection of the capacitor 7 is connected to the second connection of the resistor 6 via a further through contact, which is not illustrated.

Figure 3B:
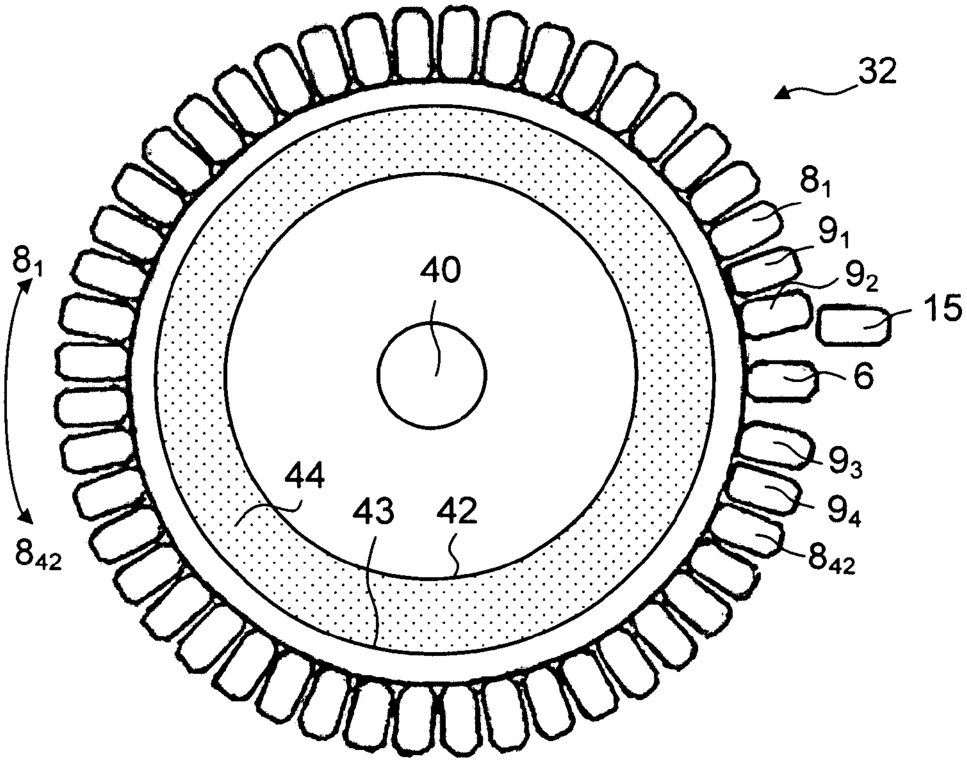
FIG. 3B shows an exemplary embodiment of the lower side of the printed-circuit board of the broadband directional coupler according to the invention.

FIG. 3B shows the second side 32 or respectively the side 32 of the printed-circuit board 30 facing away from the input connection 13. The inner conductor 1 is guided on the second side 32 through recess 40 of the printed-circuit board 30. Two rings 42 and 43 are identifiable. The area 44 between the two rings shows the contact surface of the spring element 45, which is connected to the second side 32 of the printed-circuit board 30 via the contact surface in such a manner that a low ohmic electrical contact between the spring element 45 and the printed-circuit board 13 is established. This is advantageously achieved through a soldering process. The spring element 45 is additionally anchored in the printed-circuit board 30 through boreholes in the latter, which are not illustrated, so that the spring element 45 also remains firmly connected to the printed-circuit board 30 even when subjected to radial forces. Various components are arranged in a circle around the spring element 45. The resistor 8 from FIG. 1 is composed in this context from a plurality of individual resistors connected in parallel, which are arranged in a circle around the spring element 45 and contact the latter. The resistors in the exemplary embodiment are 42 individual resistors $\mathbf{8}_1$ to $\mathbf{8}_{42}$. Their second connection is connected to the external outer conductor 38 of the broadband directional coupler. The resistor ring which comprises the resistors arranged in a circle, is interrupted at the de-coupling connection, thereby providing an annular segment with two ends. It is desirable for the current on the internal outer conductor 3 to flow uniformly across all resistors $\mathbf{8}_1$ to $\mathbf{8}_{42}$ towards the external outer conductor 38.

Each resistor provides a resistance value in the exemplary embodiment of approximately 12.1 ohms, wherein the nominal resistance value declines in principle towards the ends of the resistor ring. The resistors $\mathbf{8}_1$ to $\mathbf{8}_{42}$ provide a resistance value of 10 ohms. The inductance associated with each resistor should be reduced by the parallel connection in such a manner that no phase errors occur in the measured value. However, in reality, the inductance of the parallel connected resistors $\mathbf{8}_1$ to $\mathbf{8}_{42}$ differs in such a manner from the calculated model that an additional compensation is meaningful. For this purpose, the capacitor 9 from FIG. 1 is formed from up to four individual capacitors $\mathbf{9}_1$ to $\mathbf{9}_4$, of which two capacitors in each case are connected with their connections in parallel at each end of the resistor ring. The capacitance of the parallel connected capacitors $\mathbf{9}_1$ to $\mathbf{9}_4$ is selected in such a manner that the inductance of the parallel connected resistors $\mathbf{8}_1$ to $\mathbf{8}_{42}$ is compensated, for example, at a frequency of 250 MHz.

The resistor 6 of the voltage splitter is disposed between the two ends of the resistor ring. The resistor 11, at the second connection of which a measured voltage is picked up, which is proportional to the root of the power of the forward or returning high-frequency signal, is disposed immediately adjacent and connected via its first connection to the first connection of the resistor 6. In the exemplary embodiment, the resistor 11 provides a resistance value of approximately 160 ohms. This measured voltage is guided with a coaxial plug, preferably an SMP or SMA coaxial plug connection, out from the broadband directional coupler, which is attached to the de-coupling connection 15.

Figure 4:
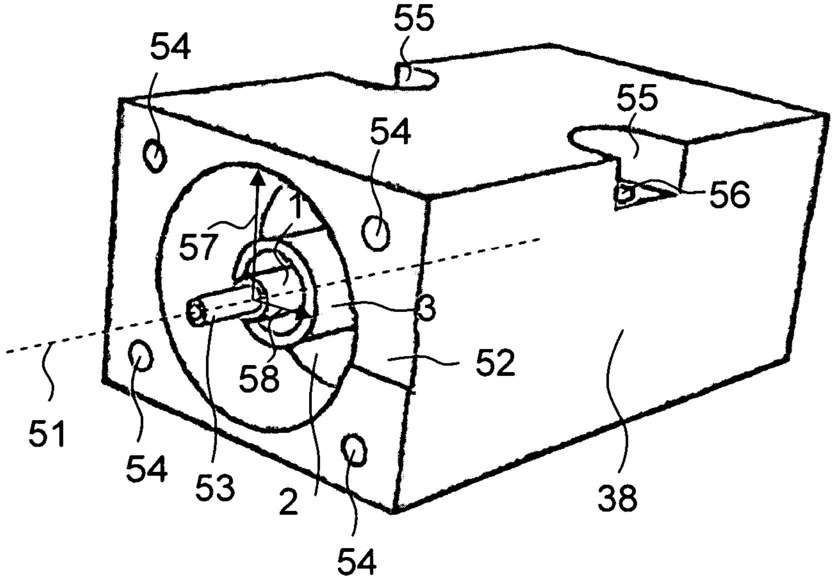
FIG. 4 shows an exemplary embodiment of the housing design with a view of the conductor structures of the broadband directional coupler according to the invention.

FIG. 4 shows the housing element 38 of the broadband directional coupler according to the invention. The housing element 38 comprises a solid, conductive metal, preferably aluminium. Two cylindrical recesses, the walls of which form an internal 3 and an external outer conductor 38 are formed in this solid, conductive housing element 38, on the left-hand side and the right-hand side respectively. The external outer conductor 38 is disposed at the same potential as the housing element 38 and therefore provides the same reference number. These cylindrical recesses provide an internal radius 58 and an external radius 57. The external radius 57 is slightly larger than the external radius of the toroidal-tape core 2 designed as a hollow cylinder. The internal radius 58 is slightly smaller than the internal radius of the toroidal-tape core 2 defined as a hollow cylinder. Accordingly, the toroidal-tape core 2 can be introduced into the housing element 38 of the broadband directional coupler.

A full cylinder still remains along the longitudinal axis 51 of the housing element 38 after the first recess, with an external radius, which corresponds to the internal radius 58 of the first cylindrical recess. The first recess, which is implemented on both sides of the housing element 38, must be only so deep that the toroidal-tape core 2 can just be introduced and, at the same time, the printed-circuit board can be screwed to both ends of the housing element 38. The first left-hand and right-hand recesses in this context are separated by a metallic dividing wall 71. The recess itself can preferably be formed by milling.

The full cylinder and accordingly the internal outer conductor 3, which remains along the longitudinal axis 51 of the housing element 38, is expanded through a further left-hand and right-hand cylindrical recess to form the hollow cylinder. The internal radius of the hollow cylinder must be so large that an inner conductor 1 can be introduced without a contact of the inner conductor 1 with the internal outer conductor 3 occurring, either as a result of direct contact or as a result of a spark-over resulting from excessively high electrical field strengths. By contrast with the first recess, this second recess extends along the longitudinal axis 51 through the entire housing element 38. The recess is advantageously implemented by drilling or milling. Accordingly, two independent measuring units 22 and 23 are formed for the forward and returning high-frequency signal.

The inner conductor 1 can be provided with a threaded borehole at its ends, so that it can be screwed to the printed-circuit board 30. A part of a screw 53 is illustrated in FIG. 4 by way of example. The housing element 38 provides four threaded boreholes 54 at each end, each of which provides the same spacing distance from one corner. A printed-circuit board 30 and a housing cover 62 is screwed down via these threaded boreholes 54 at each end of the housing element 38 of the broadband directional coupler, wherein the printed-circuit boards 30 are preferably structured in an identical manner. Furthermore, the housing element 38 provides a lateral indentation 52, which is shaped in such a manner that it matches an SMP or SMA coaxial plug connection, which is attached to the printed-circuit board 30. At the centre of the upper side, the housing element 38 provides a recess 55 at each edge, the shape of which corresponds to half of a full cylinder. A further threaded borehole 56 is formed at the base of this recess 55 in each case. The housing element 38 of the broadband directional coupler can be fixed permanently within a further housing or device via this threaded borehole 56.

Figure 5:
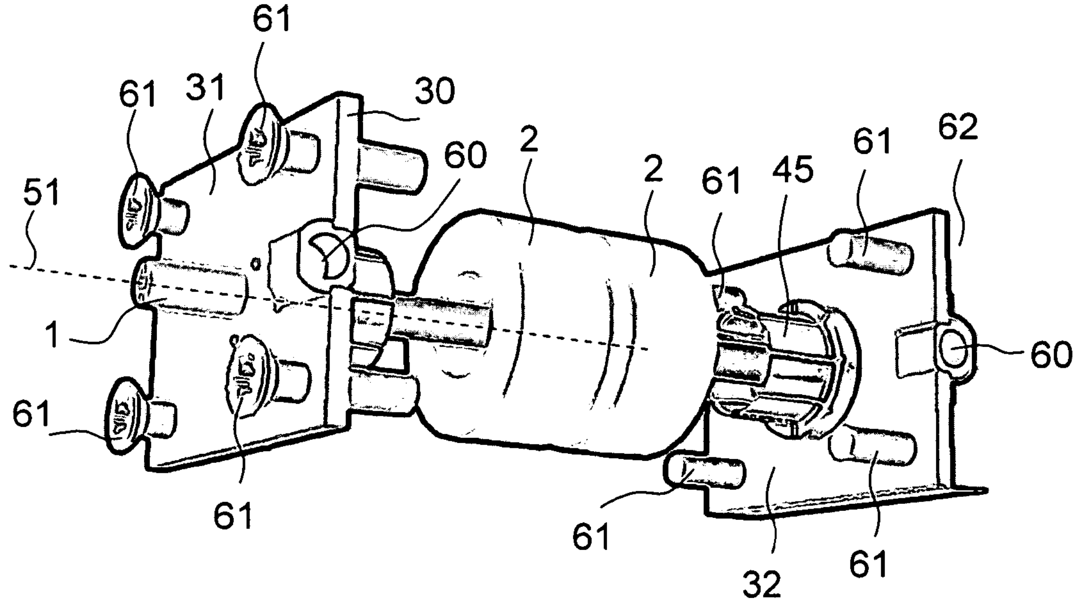
FIG. 5 shows an internal view of the broadband directional coupler according to the invention.

FIG. 5 shows an internal view of the broadband directional coupler without the housing element 38. The two toroidal-tape cores 2, which are arranged at a distance from one another separated by a metallic dividing wall 71, which is not illustrated, are clearly visible in the centre of the broadband directional coupler around the internal outer conductor 3, which is not illustrated in FIG. 5. Dependent upon the embodiment, the inner conductor 1 comprises a continuous conductor, as illustrated in FIG. 5, or conductor segments, in the end of each of which a thread is formed, by means of which two conductors can be connected with a corresponding screw 53. The inner conductor 1 in this context is built up from 3 conductor segments, wherein one conductor segment is disposed in each case on the first side 31 of the printed-circuit board 30 of each measuring unit 22, 23. A further conductor segment connects the second side 32 of the first printed-circuit board 30 of the first measuring unit 22 to the second side 32 of the second printed-circuit board 30 of the second measuring unit 23. The inner conductor 1 is guided in this context in a concentric manner through the left-hand and right-hand recess. The diameter of the inner conductor 1 is matched in such a manner here that a surge impedance of the broadband coupler is matched to a system surge impedance especially of 50 ohms. For this purpose, the diameter of the inner conductor 1 can be varied in a multiple manner. This is possible with a continuous inner conductor 1 and also with an inner conductor 1 comprising several inner-conductor segments.

Furthermore, the spring element 45, which is arranged on the second side 32 of the printed-circuit board 30, is shown in FIG. 5. The spring element 45 comprises individual, mutually separated spring segments, which can be bent radially outwards subject to the effect of a force. The spring element 45 is arranged on the side of the printed-circuit board 30 facing away from the input connection 13 in such a manner that it encloses the internal outer conductor 3 so that a low ohmic electrical contact is established and, at the same time, radial movements of the internal outer conductor 3 are no longer possible.

Furthermore, several fastening elements 61, preferably screws, are shown, which connect the housing cover 62 to the printed-circuit board 30 and the housing element 38 in such a manner that a low ohmic electrical contact and therefore a continuous external outer conductor 38 is established. Moreover, each printed-circuit board 30 provides at least one SMP or SMA coaxial plug connection 60, which is connected to the de-coupling connection 15 and the external outer conductor 38. For this purpose, corresponding recesses 52 are implemented in the housing cover 62 and in the housing element 38.

Figure 6:
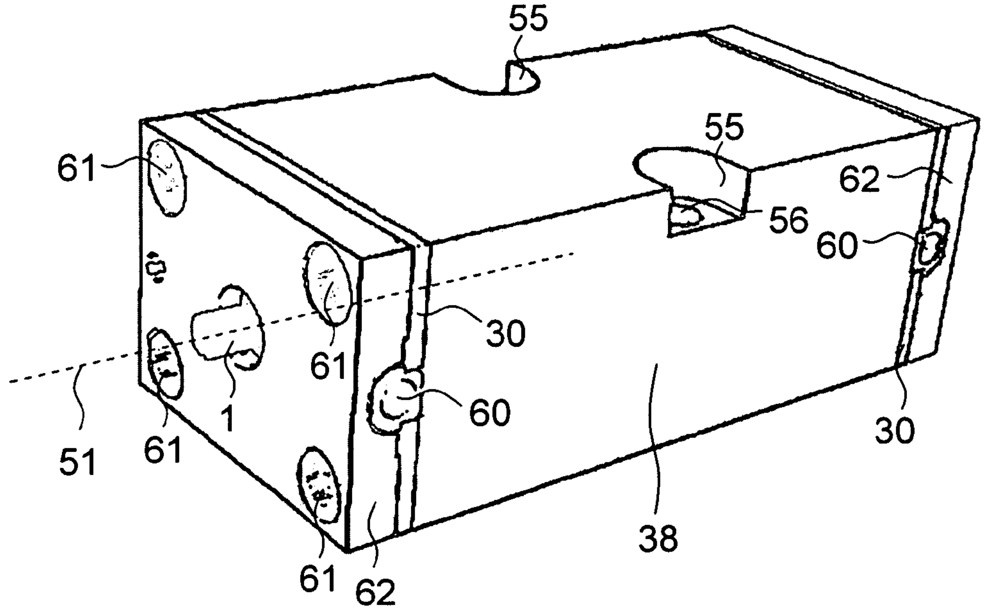
FIG. 6 shows the complete broadband directional coupler according to the invention with both printed-circuit boards and housing covers.

FIG. 6 shows the complete broadband directional coupler comprising the housing cover 62, the printed-circuit board 30 and the housing element 38. As shown in FIG. 4, the housing element provides two recesses 55, which each provide a threaded borehole 56. The housing cover 62 provides four countersunk threaded boreholes at the corners, so that the housing cover 62 can be rigidly fixed by the screws 61 together with the printed-circuit board 30 onto the housing element 38. A further borehole in the housing cover 62 ensures that the inner conductor 1 can be guided out of the broadband directional coupler. At the end of the inner conductor 1, a coaxial plug connection can be attached.

Figure 7:
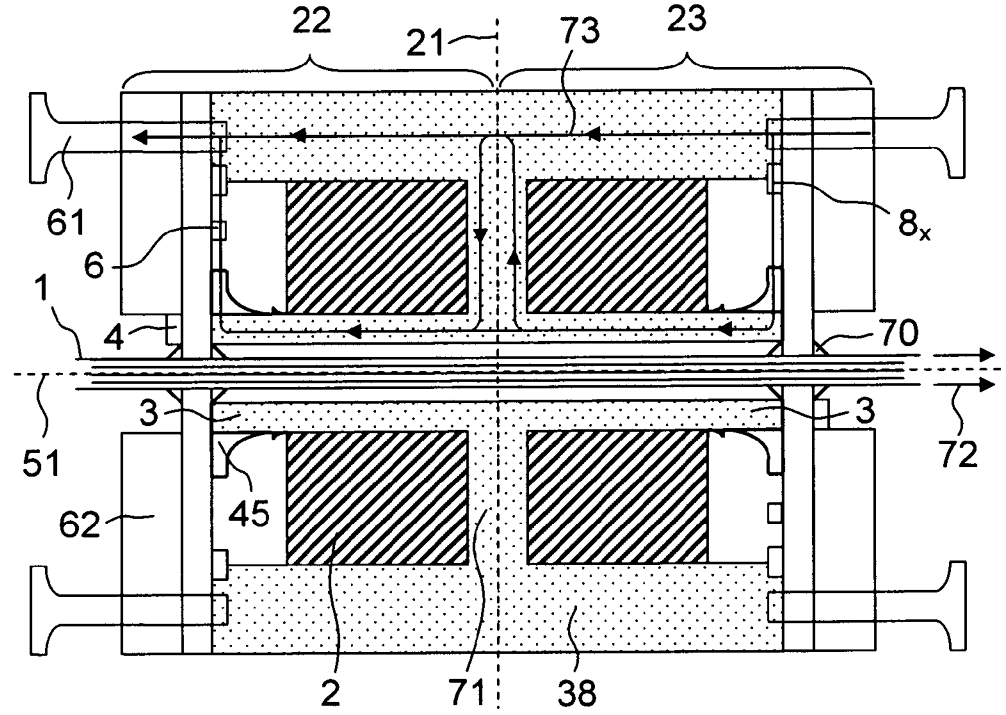
FIG. 7 shows a section along the longitudinal axis through the broadband directional coupler according to the invention.

By way of illustration of the structure, FIG. 7 shows a section along the longitudinal axis 51 through the broadband directional coupler according to the invention. The individual components of the broadband directional coupler, comprising the housing cover 62, the printed-circuit board 30 and the housing element 38, which are rigidly connected to one another via the screws 61, can be seen here particularly clearly. The inner conductor 1 is guided through the continuous borehole through the broadband directional coupler. The non-conductive centring elements 70 are used to hold the inner conductor 1 in position. Via a soldered connection 37, which is not illustrated here, the resistor 4 of the voltage splitter is connected galvanically to the inner conductor 1. The cylindrical recesses on the left-hand and right-hand side, into which the toroidal-tape cores 2 are introduced, can be readily seen alongside the mirror-image symmetrical structure of the arrangement along the axis 21.

On the one hand, the cylindrical recesses are separated from one another by the metallic dividing wall 71, so that two independent measuring units 22 and 23 for the forward and returning high-frequency signal are formed; and, on the other hand, the internal outer conductor 3 is connected via this metallic dividing wall 71 to the external outer conductor 38 and accordingly to the housing element 38. The spring element 45, already described with reference to FIG. 3B and FIG. 5, through which the internal outer conductor 3 is electrically contacted in a low ohmic manner with the printed-circuit board 30, is clearly shown. This spring element 45 is used at the same time for fixing the toroidal-tape cores 2, so that movements in an axial direction are no longer possible. Via the printed-circuit board 30, the current flows across the resistor 8 from the internal outer conductor 3 back to the external outer conductor 38. In the region of the external outer conductor 38, the printed-circuit board 30 is coated on both sides, for example, with copper, and through-contacted several times. Via the firmly tightened screw connections 61, the external outer conductor 38 is electrically connected through the printed-circuit board 30 to the housing cover in a low-ohmic manner.

If the end of the inner conductor 1 of the first measuring unit 22 is connected to the output of a power amplifier, and the second end of the inner conductor 1 of the second measuring unit 23 is connected to a complex load, a current characteristic corresponding to the direction of the arrow 72 is established on the inner conductor 1 in the case of a positive half wave of the high-frequency signal and subject to the condition that the power is transferred exclusively from the power amplifier into the complex load. In this exemplary connection, a measured voltage is provided at the de-coupling connection 15 of the first measuring unit 22, which is proportional to the root of the power of the forward high-frequency signal, and a measured voltage is provided at the de-coupling connection 15 of the second measuring unit 23, which is proportional to the root of the power of the returning high-frequency signal.

The measured voltage decreasing across the voltage splitter of each measuring unit 22 and 23 is of identical magnitude and, in this example, positive. The current characteristic of the current flowing back in this example via the housing cover 62, the printed-circuit board 30 and the housing element 38 corresponds to the direction of the arrow 73. The current is split at the input of the second measuring unit 23, wherein only a small portion flows back along the external outer conductor 38 to the power amplifier. The majority flows across the resistor 8 of the second measuring unit 23 towards the internal outer conductor 3 of the second measuring unit. Corresponding to the circuit diagram from FIG. 1, a negative voltage decreases in this case across the resistor 8 of the second measuring unit 23. This voltage is supplied at the node 12 of the second measuring unit 23 to the positive voltage of the voltage splitter. Both voltages have the same amplitude but different signs. In this case, no voltage is measured at the de-coupling connection 15 of the second measuring unit 23.

A part of the current from the internal outer conductor 3 of the second measuring unit 23 flows via the metallic dividing wall 71 back into the external outer conductor 38. A part of the current from the internal outer conductor 3 of the second measuring unit 23 flows together with a part of the current coming from the external outer conductor 38 into the internal outer conductor 3 of the first measuring unit 22. This current flows across the resistor 8 of the first measuring unit 22 back to the external outer conductor 38. Corresponding to the circuit diagram from FIG. 1, a positive voltage decreases in this case across the resistor 8 of the first measuring unit 22. This voltage is added at the node 12 of the first measuring unit 22 to the positive voltage of the voltage splitter. Both voltages have the same amplitude and the same sign. A voltage, which is proportional to the root of the power of the forward high-frequency signal, is measured in this case at the de-coupling connection 15 of the first measuring unit 22.

The same applies for the negative half wave of the high-frequency signal, only in this case, the signs for voltage and current are switched. The same applies for the case that the signal source is connected to the input connection 13 of the second measuring unit 23, and the complex load is connected to the input connection 13 of the first measuring unit 22.

In the case of a standing-wave ratio greater than one, a voltage can be measured at both de-coupling connections 15. The power of the forward and the returning high-frequency signal can be calculated from these two voltages. The high-permeability toroidal-tape cores 2 ensure that the majority of the current flows across the resistor 8. Without the toroidal-tape cores 2, an inductance would build up in the then empty cylindrical recess, across which the resistor 8 would be short-circuited. Accordingly, no significant voltage drop could be measured across the resistor 8. The permeability of the toroidal-tape core 2 in this context determines the lower operating frequency of the broadband directional coupler.

The invention is not restricted to the exemplary embodiment illustrated. All of the elements described and/or illustrated can be combined with one another as required within the framework of the invention.

While illustrative embodiments have been illustrated and described, it will be appreciated that various changes can be made therein without departing from the spirit and scope of the invention.

The invention claimed is:

1. A broadband directional coupler for measuring the power of a forward and/or a returning high-frequency signal on a line, comprising:

- a voltage splitter connected to an inner conductor of the line, and a first resistor connected to an outer conductor of the line, wherein the voltage splitter comprises ohmic resistors;
- a first connection of a second resistor is connected to the inner conductor of the line;
- a second connection of the second resistor is connected to a first connection of the third resistor, and a second connection of the third resistor is connected directly or indirectly to a first connection of the first resistor and the outer conductor of the line,
- wherein at least one capacitor is connected in parallel to the connections of the first and/or of the third resistor, and/or a second connection of the first resistor is connected to ground.

2. The broadband directional coupler according to claim 1, wherein a measured voltage is picked up at the second connection of the second resistor or at the first connection of the third resistor.

3. The broadband directional coupler according to claim 1, wherein the capacitor which is connected in parallel to the connections of the third resistor is a trimming capacitor, of which the capacitance is adjusted in such a manner that a time constant is obtained from the capacitance of the trimming capacitor and the resistance value of the third resistor, which is at least approximately equal to a further time constant, which is obtained from the resistance value of the second resistor together with its cap capacitance.

4. The broadband directional coupler according to claim 1, wherein:

- a first connection of a further capacitor and a first connection of a fourth resistor are connected to the second connection of the second resistor or to the first connection of the third resistor;
- a second connection of the further capacitor is connected to ground; and
- a measurement signal is provided at a second connection of the fourth resistor.

5. The broadband directional coupler according to claim 1, wherein the line is a coaxial line.

6. A broadband directional coupler for measuring the power of a forward and/or a returning high-frequency signal on a line, comprising:

- a voltage splitter connected to an inner conductor of the line, and a first resistor connected to an outer conductor of the line, wherein the voltage splitter comprises ohmic resistors;
- a first connection of a second resistor is connected to the inner conductor of the line;
- a second connection of the second resistor is connected to a first connection of the third resistor, and a second connection of the third resistor is connected directly or indirectly to a first connection of the first resistor and the outer conductor of the line,
- wherein the resistors and the capacitors are mounted on a printed-circuit board, and
- wherein the second resistor and the third resistor are not arranged on the same side of the printed-circuit board, the third resistor being arranged on the same side of the printed-circuit board as the first resistor.

7. The broadband directional coupler according to claim 6, wherein the inner conductor is soldered and/or screw-connected to the printed-circuit board.

8. A broadband directional coupler for measuring the power of a forward and/or a returning high-frequency signal on a line, comprising:

- a voltage splitter connected to an inner conductor of the line, and a first resistor connected to an outer conductor of the line, wherein the voltage splitter comprises ohmic resistors;
- a first connection of a second resistor is connected to the inner conductor of the line;
- a second connection of the second resistor is connected to a first connection of the third resistor, and a second connection of the third resistor is connected directly or indirectly to a first connection of the first resistor and the outer conductor of the line, and a conductive housing element, in which two cylindrical recesses of which the walls form an internal and an external outer conductor, are formed respectively on the left-hand and the right-hand side.

9. The broadband directional coupler according to claim 8, wherein on both sides between the internal and the external outer conductor, at least one high-permeability toroidal-tape core is arranged.

10. The broadband directional coupler according to claim 8, wherein two cylindrical recesses are separated by a metallic dividing wall, wherein two independent measuring units are formed for the forward and the returning high-frequency signal.

11. The broadband directional coupler according to claim 10, wherein each measuring unit provides at least one input connection and at least one de-coupling connection, and each input connection can be connected to a source or to a load, and wherein a measurement signal proportional to the root of the power of the forward high-frequency signal or proportional to the root of the power of the returning high-frequency signal is connected at the de-coupling connection.

12. The broadband directional coupler according to claim 8, wherein the resistors and the capacitors are mounted on a printed-circuit board, and wherein the printed-circuit board and a housing cover is fitted at each of the two ends of the housing element of the broadband directional coupler.

13. The broadband directional coupler according to claim 8, wherein the inner conductor is guided concentrically through two cylindrical recesses of the housing element, of which the diameter is adapted in such a manner that a surge impedance of the broadband coupler is adapted to a specified system surge impedance of 50 ohms.

14. The broadband directional coupler according to claim 8, wherein the resistors and the capacitors are mounted on a printed-circuit board, and wherein on each side of the printed-circuit board facing away from the input connection, a spring element is arranged, which encloses the internal outer conductor in such a manner that an electrical contact is established, and at the same time, radial movements of the internal outer conductor are no longer possible.

15. The broadband directional coupler according to claim 14, wherein the first resistor comprises a plurality of individual, parallel-connected, individual ohmic resistors, which are arranged in a ring shape around the spring element and contact the latter.

16. The broadband directional coupler according to claim 15, wherein a resistor ring comprising the individual resistors arranged in a ring shape is interrupted at the de-coupling connection and accordingly, an annular segment with two ends is formed, and at least one capacitor is connected in parallel at each end.

17. The broadband directional coupler according to claim 16, wherein the third resistor is arranged centrally at an interruption point of the resistor ring.

* * * * *